(12) United States Patent
Bartko

(10) Patent No.: US 10,830,804 B2
(45) Date of Patent: Nov. 10, 2020

(54) METHOD AND MEASUREMENT SYSTEM FOR DETERMINING A PHASE CENTER OF AN ANTENNA UNDER TEST

(71) Applicant: Rohde & Schwarz GmbH & Co. KG, Munich (DE)

(72) Inventor: Hendrik Bartko, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 290 days.

(21) Appl. No.: 16/020,553

(22) Filed: Jun. 27, 2018

(65) Prior Publication Data
US 2020/0003816 A1  Jan. 2, 2020

(51) Int. Cl.
*G01R 29/10* (2006.01)

(52) U.S. Cl.
CPC ..................... *G01R 29/10* (2013.01)

(58) Field of Classification Search
CPC .... G08B 13/2408; G01V 15/00; G01R 33/12; G01R 33/0385; G01R 31/2648; G01N 27/9046; G01N 27/72; G01N 27/023; G01B 7/105
See application file for complete search history.

(56) References Cited

U.S. PATENT DOCUMENTS

| | | | |
|---|---|---|---|
| 5,936,575 A * | 8/1999 | Azzarelli | G01S 3/06 342/362 |
| 8,570,214 B2 | 10/2013 | Shirai | |
| 2010/0123624 A1 | 5/2010 | Minear et al. | |
| 2018/0031622 A1 * | 2/2018 | Tankielun | H01Q 1/40 |
| 2018/0109335 A1 * | 4/2018 | Rowell | H01Q 19/065 |

FOREIGN PATENT DOCUMENTS

| | | |
|---|---|---|
| CN | 101320062 B | 10/2010 |
| CN | 102323489 B | 11/2013 |

* cited by examiner

*Primary Examiner* — Tung X Nguyen
(74) *Attorney, Agent, or Firm* — Christensen O'Connor Johnson Kindness PLLC

(57) ABSTRACT

A method for determining a phase center of an antenna under test is described wherein the antenna under test is placed on a positioning unit within an anechoic space of a measurement system, the positioning unit being configured to set the antenna under test in at least one angular orientation. At least the phase of a measurement signal assigned to the antenna under test is determined in dependency of the angular orientation of the antenna under test. The phase center of the antenna under test is determined by using least-square techniques while taking the phase of the measurement signal into account, and an uncertainty of the determination of the phase center is determined based on the outcome of the determination of the phase center of the antenna under test by using the least-square techniques. In addition, a measurement system is described.

15 Claims, 1 Drawing Sheet

METHOD AND MEASUREMENT SYSTEM FOR DETERMINING A PHASE CENTER OF AN ANTENNA UNDER TEST

FIELD OF THE DISCLOSURE

Embodiments of the present disclosure relate generally to a method as well as a measurement system for determining a phase center of an antenna under test.

BACKGROUND

It is known that the phase center of an antenna is a very important characteristic. In general, the phase center corresponds to the location of the antenna from which the electromagnetic radiation spreads spherically outwards, with the phase of the signal being equal at any point on the sphere. In the state of the art, several techniques are known to determine or rather measure the phase center of a respective antenna, in particular the location of the phase center with regard to the antenna. Moreover, it is very important that the phase center can be determined or rather measured with a low measurement uncertainty. This becomes even more important for antennas being used in global positioning system applications or similar applications, for instance in automotive or aviation applications.

So far, the measurement uncertainty was determined for the measurement setup used for determining the phase center of the antenna, namely the measurement system itself. Thus, known antennas were tested with the respective measurement setup so as to perform test measurements used for evaluation purposes later wherein the measurement uncertainty of the antenna under test was evaluated by using simulation techniques.

However, this approach does not yield satisfying results since the measurement uncertainty obtained is based on a model applied which may be incorrect.

Accordingly, there is a need for a cost-efficient possibility to determine the measurement uncertainty of the phase center in a more precisely and reliable manner.

SUMMARY

Embodiments of the present disclosure provide a method for determining a phase center of an antenna under test, with the following steps:

placing the antenna under test on a positioning unit within an anechoic space of a measurement system, the positioning unit being configured to set the antenna under test in at least one angular orientation;

determining at least the phase of a measurement signal assigned to the antenna under test in dependency of the angular orientation of the antenna under test;

determining the phase center of the antenna under test by using least-square techniques while taking the phase of the measurement signal into account; and determining an uncertainty of the determination of the phase center of the antenna under test based on the outcome of the previous determination of the phase center of the antenna under test.

Furthermore, embodiments of the present disclosure provide a measurement system for measuring a phase center of an antenna under test, the system comprising:

an anechoic space;

a positioning unit for the antenna under test, the positioning unit being located in the anechoic space; and a measurement and evaluation unit, the measurement and evaluation unit being configured to retrieve at least one angular orientation of the positioning unit;

the measurement and evaluation unit being further configured to determine at least the phase of a measurement signal assigned to the antenna under test in dependency of at least one angular orientation of the antenna under test set by the positioning unit;

the measurement and evaluation unit being further configured to determine the phase center of the antenna under test by using least-square techniques while taking the phase of the measurement signal into account; and the measurement and evaluation unit being further configured to determine an uncertainty of the determination of the phase center of the antenna under test based on the outcome of the previous determination of the phase center of the antenna under test.

Accordingly, the present disclosure is based on the finding that the uncertainty that occurs during the determination of the phase center can also be determined in situ or rather directly for each individual measurement without the need for using simulation data and/or simulation techniques. In some embodiments, the uncertainty can be obtained directly when determining the phase center of the antenna under test. In other words, the phase center of the antenna under test, namely the location of the phase center, is determined which corresponds to the phase center offset (PCO) along with its uncertainty. In some embodiments, the uncertainty, occurring while the phase center of the antenna under test is determined, is quantified appropriately in a direct manner.

For determining the phase center of the antenna under test, at least two measurements at different angular orientations are done. Hence, the phase of the measurement signal is measured or rather determined twice for different angular orientations. In general, the measurement signal may be outputted by the antenna under test so that the measurement system comprises at least one signal receiver configured to determine at least the phase of the measurement signal.

The antenna under test may be located on another object, for instance a car, an airplane, a drone or any other object or a part thereof. The other object may be an object that is equipped with the antenna under test under real application conditions.

The uncertainty of the phase center of the antenna under test may be determined by substantially applying least-square techniques. In some embodiments, the outcome of the determination of the phase center of the antenna under test that uses least-square techniques is used, namely the minimized result. This minimized result is used for determining the uncertainty of the determination of the phase center of the antenna under test.

Accordingly, the phase center of the antenna under test is determined first by using least-square techniques. Afterwards, the outcome or rather the minimized result thereof is used for determining the uncertainty of the determination of the phase center wherein least-square techniques are used again.

In some embodiments, the phase center of the antenna under test is determined by using the following formula:

$$\chi^2(\text{phase center}) = \sum_{i=1}^{N} (\varphi_{mess,i} - \varphi_{model,i}[\text{phase center}])^2,$$

wherein parameter N is the total number of measurements (at least two), parameter i corresponds to a specific measurement, namely the first one, the second one and so on, and $$\varphi_{model,i}[\text{phase center}] = \frac{2\pi}{\lambda} a \cos\alpha,$$

wherein parameter a is an position offset of the phase center with respect of the rotational center and α corresponds to an offset with regard to the angular orientation of the phase center, for example with regard to a rotational angle of 0. In addition, the wavelength is taken into account for determining the phase center.

The first mentioned formula is minimized so as to determine the phase center of the antenna under test yielding $\chi_{min}^2$, namely the minimized result or rather the outcome of the determination of the phase center. Hence, the location of the phase center of the antenna under test is determined by using least-square techniques which can be described by the respective formula mentioned above.

This minimized result or rather the outcome is further used to determine the uncertainty of the determination of the phase center, also called measurement uncertainty, by using the following formula:

$$\chi_{min}^2 = \frac{N}{N+1} \sum_{i=1}^{N} (\varphi_{mess,i} - \varphi_{model,i}[\text{phase center} + \Delta(\text{phase center})])^2.$$

In some embodiments, the uncertainty is provided by $\Delta$(phase center).

As all parameters of the formula mentioned above are known, the uncertainty $\Delta$(phase center) can be determined directly.

Hence, the uncertainty of the determination of the phase center of the antenna under test can be determined in situ or rather directly. It is not necessary that any simulation data is used and/or test measurements with known antennas are performed for calculating the respective uncertainty. Therefore, a cost-efficient and reliable possibility is given to determine the uncertainty of the determination of the phase center of the antenna under test.

In general, the uncertainty of the determination of the phase center of the antenna under test is also called measurement uncertainty.

An aspect provides that the positioning unit is a rotatable positioning unit so that the angular orientation corresponds to a rotation angle. Hence, the antenna under test may be rotated during different measurements so as to determine the phase center of the antenna unit for at least two different rotation angles that are taken into account when determining the phase of the measurement signal.

The amplitude of the measurement signal may also be determined in dependency of the angular orientation, namely the rotation angle, of the antenna under test. Thus, the phase as well as the amplitude of the measurement signal used for characterizing the antenna under test is used. In some embodiments, the phase center of the antenna under test is determined.

Furthermore, the measurement uncertainty of the phase center of the antenna under test may be used for informing a user of the measurement system. Hence, deviations which may occur during the measurement can be directly identified so that the user of the measurement system is informed appropriately. Thus, measurements can be repeated (for the respective angular orientation) when untypically high measurement uncertainties are determined. In addition, the measurement system can be investigated with regard to any errors or failures.

In some embodiments, a failure can be identified earlier so that the overall efficiency is increased.

For instance, the measurement uncertainty of the phase center of the antenna under test is displayed on a display of the measurement system. Thus, the user receives a visual feedback with regard to the measurement uncertainty. The value of the measurement uncertainty may be outputted. Additionally or alternatively, a certain color, for instance green and/or red, can be displayed so as to inform the user of the measurement system with respect to the measurement uncertainty in an intuitive manner.

Generally, the measurement uncertainty of the phase center of the antenna under test may be used as an indicator of the measurement quality. Once the measurement uncertainty of the phase center is high, the user may recognize that the appropriate measurement or the determination of the phase center may be inappropriate and should be repeated.

According to another aspect, the measurement uncertainty of the phase center of the antenna under test is compared with a threshold value so that a warning is outputted when the threshold value is at least one of reached and exceeded. The respective threshold value may be determined previously. Typical measurement uncertainties to be expected can be used for setting the threshold value, for instance the threshold value may correspond to a typical measurement uncertainty to be expected multiplied by a factor such as 2. Hence, a warning is outputted when the measurement uncertainty determined is higher than 2 times the measurement uncertainty expected.

In some embodiments, the comparison takes place for each individual measurement directly.

Moreover, a transformation may be performed so that near field measurement data is transformed into far field measurement data. The method for determining a phase center as well as the measurement uncertainty of the phase center determination can also be used for data obtained from near field measurements since the respective data is transformed into far field data which can be processed appropriately, for example this data can be inputted in the respective formula mentioned above so as to determine the phase center of the antenna under test as well as the measurement uncertainty.

According to another aspect, at least one of a theta range and a phi range are chosen around the main beam. Hence, a (substantially spherical) area is scanned for measuring and/or determining the location of the phase center of the antenna under test. The area is chosen such that it is ensured to determine the phase center appropriately.

Alternatively, ranges with regard to elevation and azimuth are taken into account.

Furthermore, a measurement range is chosen that relates to a pre-defined attenuation with regard to a respective maximum of the measurement signal. Accordingly, the angular orientations used for determining the phase of the measurement signal are chosen based on the power level wherein thresholds are defined by relative attenuation such as −3 dB, −6 dB and −10 dB below the maximum of the measurement signal.

Another aspect provides that the positioning unit is a rotatable positioning unit so that the angular orientation corresponds to a rotation angle. Hence, the antenna under test placed on the positioning unit may be rotated so that different rotation angles are taken into account when determining the phase of the measurement signal.

Generally, the measurement and evaluation unit may be configured to perform the method as defined above.

The measurement and evaluation unit may be configured to compare the uncertainty of the determination of the phase center of the antenna under test with a threshold value, the measurement and evaluation unit being further configured to output a warning when the threshold value is at least one of reached and exceeded. Thus, the user of the measurement system is warned by the measurement system once the uncertainty determined reaches or rather exceeds a predefined threshold value so that the respective measurement can be repeated.

The comparison takes place for each individual measurement, namely each angular orientation.

For instance, the measurement system comprises at least one of a display and an output unit for outputting a warning to a user of the measurement system. The respective warning may be outputted in a visual manner via the display so that the user gets warned appropriately. This can be done by displaying the respective value determined for the measurement uncertainty and/or by displaying a certain color.

Alternatively or supplementarily, the output unit is used for warning the user of the measurement system. The output unit may be an acoustic one so that a warning tone is outputted for warning the user acoustically.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
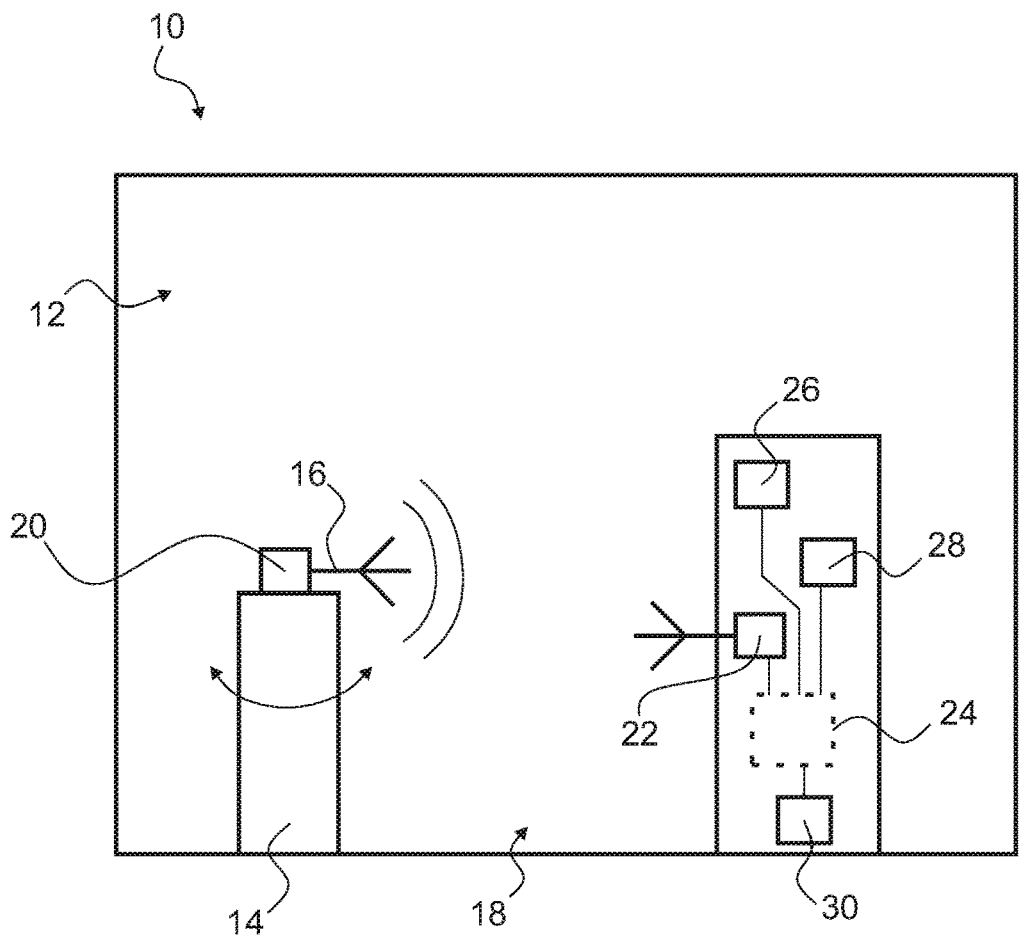
FIG. 1 schematically shows an overview of one representative measurement system according to an aspect of the present disclosure.

FIG. 1 illustrates one representative example of a measurement system 10 for determining a phase center of an antenna under test. As shown in FIG. 1, the measurement system 10 comprises an anechoic space 12 in which a positioning unit 14 is located. The anechoic space 12 may be an anechoic chamber, an anechoic room and/or an anechoic testing hall.

The positioning unit 14 is used for holding an antenna under test 16 that may be placed on the positioning unit 14. The antenna under test 16 may also be attached to another object such as a car, a drone, an airplane or rather a part thereof.

Figure 2:
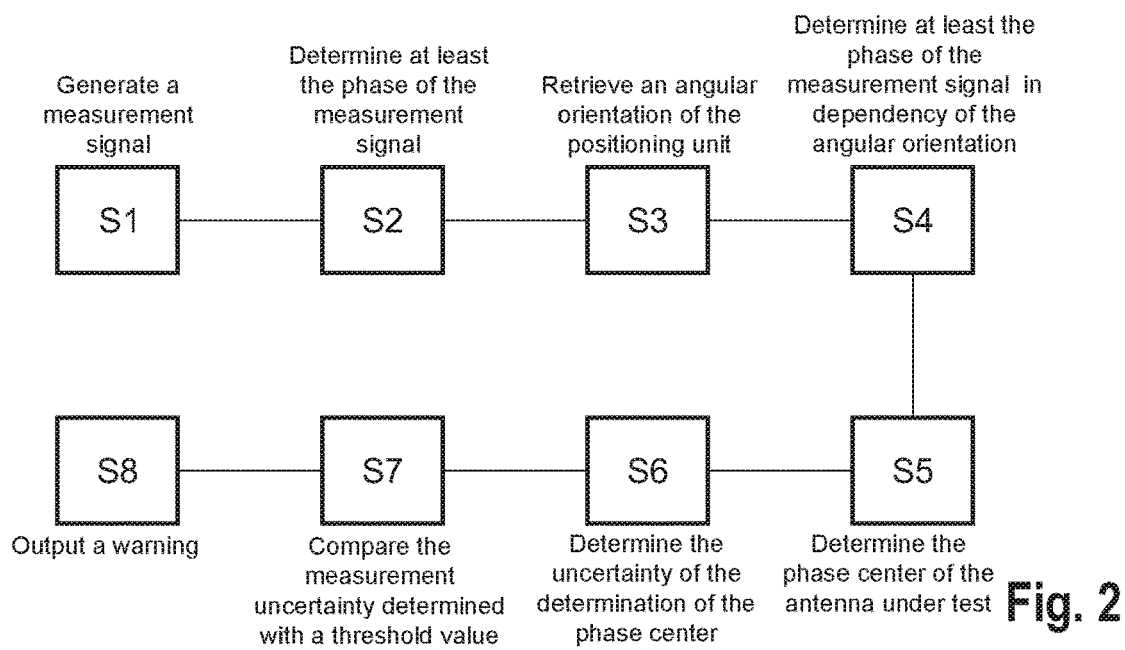
FIG. 2 schematically shows a flow-chart illustrating an example of a method according to an aspect of the present disclosure.

The measurement system 10 also comprises a measurement and evaluation unit 18 encompassing a signal generator 20 configured to generate a measurement signal as well as a signal receiver 22 configured to receive a measurement signal transmitted via the antenna under test 16 as will be described hereinafter with respect to FIG. 2.

In general, the measurement system 10, for example the measurement and evaluation unit 18, is configured to determine the phase center of the antenna under test 16 as well as the measurement uncertainty when determining the phase center of the antenna under test 16. For this purpose, the measurement and evaluation unit 18 comprises a processing unit 24 specifically programmed or implemented to process the data received, for example the phase information of signals received by the signal receiver 22 as will be described hereinafter while also taking FIG. 2 into account.

The processing unit 24 can be implemented in hardware, software, or a combination of hardware and software. In some embodiments, the processing unit 24 includes a microprocessor, a central processing unit (CPU), a digital signal processor (DSP), an application-specific integrated circuit (ASIC), a field-programmable gate array (FPGA), or the like, or any combinations thereof. In an embodiment, the processing unit 24 includes a microprocessor and a memory (which may or may not include data storage 30) that stores logic modules and/or instructions, that when executed by the microprocessor, carry out the methodologies and technologies of the measurement and evaluation unit 18 described herein.

The signal generator 20 generates a measurement signal that is fed to the antenna under test 16 so that the respective measurement signal is transmitted via the antenna under test 16 for testing purposes (Step S1). The measurement an evaluation unit 18, for example its signal receiver 22, is configured to receive the measurement signal outputted so as to determine at least the phase of the measurement signal assigned to the antenna under test 16 (Step S2). Further, the measurement and evaluation unit 18 is configured to retrieve an angular orientation of the positioning unit 14 so that the angular orientation of the antenna under test 16 is retrieved simultaneously since the antenna under test 16 is positioned on the positioning unit 14 in a defined manner (Step S3).

Accordingly, at least the phase of the measurement signal is determined in dependency of the angular orientation of the antenna under test 16 that has been set by the positioning unit 14 for two different angular orientations. However, the amplitude of the measurement signal may also be determined in dependency of the angular orientation of the antenna under test 16.

For instance, the positioning unit 14 in some embodiments is a rotatable positioning unit so that the angular orientation corresponds to a certain rotation angle of the antenna under test 16. In one embodiment, the positioning unit 14 includes one or more rotation tables that can rotated about one or more axes via actuation of one or more respective motors.

Once the measurement and evaluation unit 18 has determined at least the phase of the measurement signal for at least two different angular orientations or rather rotation angles, the measurement and evaluation unit 18 is configured to determine the phase center of the antenna under test 16 by using least-square techniques while taking the phase of the measurement signal into account that has been determined previously (Step S5).

For this purpose, the measurement and evaluation unit 18 may use the following formula:

$$\chi^2(\text{phase center}) = \sum_{i=1}^{N} (\varphi_{mess,i} - \varphi_{model,i}[\text{phase center}])^2,$$

wherein parameter N is the total number of measurements (at least two), parameter i corresponds to a specific measurement, namely the first one, the second one and so on, and $$\varphi_{model,i}[\text{phase center}] = \frac{2\pi}{\lambda} a \cos\alpha,$$

wherein parameter a is an position offset of the phase center with respect of the rotational center and $\alpha$ corresponds to an offset with regard to the angular orientation of the phase center, for example with regard to a rotational angle of 0. In addition, the wavelength is taken into account for determining the phase center.

For determining the phase center, the outcome of the formula mentioned above is minimized which technique corresponds to the least-square approach. This yields $\chi_{min}^2$, namely the minimized result or rather the outcome of the determination of the phase center.

Once the measurement and evaluation unit 18 has determined the phase center of the antenna under test 16, the measurement uncertainty of the phase center of the antenna under test 16 or rather the uncertainty of the determination of the phase center of the antenna under test 16 can be determined based on the outcome of the previous determination of the phase center of the antenna under test 16 (Step S6). Hence, the outcome of the determination of the phase center or rather $\chi_{min}^2$ is taken into account. Therefore, the measurement and evaluation unit 18 is configured to apply the following formula:

$$\chi_{min}^2 = \frac{N}{N+1} \sum_{i=1}^{N} (\varphi_{mess,i} - \varphi_{model,i}[\text{phase center} + \Delta(\text{phase center})])^2.$$

In some embodiments, the uncertainty is provided by $\Delta(\text{phase center})$.

As all parameters of the formula mentioned above are known, the uncertainty $\Delta(\text{phase center})$ can be determined directly.

Hence, the uncertainty of the determination of the phase center of the antenna under test can be determined in situ or rather directly. It is not necessary that any simulation data is used and/or test measurements with known antennas are performed for calculating the respective uncertainty.

The measurement system 10 may also comprise a display 26 and/or an output unit 28, for instance an acoustic output unit.

In some embodiments, the measurement and evaluation unit 18, for example the processing unit 24, is configured to compare the measurement uncertainty determined with a threshold value that has been stored in data storage 30 (Step S7).

Once the measurement and evaluation unit 18 asserts that the measurement uncertainty reaches or exceeds the threshold value set, the processing unit 24 is programmed to output a warning via the display 22 in a visual manner and/or via the output unit 28 in an acoustic manner so as to warn the user of the measurement system 10 (Step S8).

The threshold value may correspond to the double of a measurement uncertainty expected. In other words, the measurement uncertainty is used as an indicator with regard to the measurement quality so that the user of the measurement system 10 gets informed immediately whether a certain measurement should be repeated, for example a measurement at a specific angular orientation.

Generally, the phase center of the antenna under test 16 is determined for a theta range and a phi range chosen around the main beam of the antenna under test 16. Hence, a partly spherical measurement area may be taken into account.

Moreover, a measurement range may be chosen that relates to a pre-defined attenuation with regard to a respective maximum of the measurement signal, for instance at least one of −3 dB, −6 dB and −10 dB below the respective maximum of the measurement signal. Hence, the phase center is determined for a certain relative power due to the pre-defined attenuation defining the measurement range.

Accordingly, the measurement system 10 ensures that the measurement uncertainty of the phase center of the antenna under test 16 can be determined directly without the need of using simulation data. Hence, the respective measurement uncertainty being an important indicator with regard to the measurement quality of the determination of the phase center of the antenna under test 16 is retrieved directly or rather in situ in a cost-efficient and reliable manner.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method for determining a phase center of an antenna under test, with the following steps:
    placing the antenna under test on a positioning unit within an anechoic space of a measurement system, the positioning unit being configured to set the antenna under test in at least one angular orientation;
    determining at least the phase of a measurement signal assigned to the antenna under test in dependency of the angular orientation of the antenna under test;
    determining the phase center of the antenna under test by using least-square techniques while taking the phase of the measurement signal into account; and
    determining an uncertainty of the determination of the phase center of the antenna under test based on the outcome of the previous determination of the phase center of the antenna under test.

2. The method according to claim 1, wherein the positioning unit is a rotatable positioning unit so that the angular orientation corresponds to a rotation angle.

3. The method according to claim 1, wherein the amplitude of the measurement signal is also determined in dependency of the angular orientation of the antenna under test.

4. The method according to claim 1, wherein the uncertainty of the determination of the phase center is used for informing a user of the measurement system.

5. The method according to claim 1, wherein the uncertainty of the determination of the phase center test is displayed on a display of the measurement system.

6. The method according to claim 1, wherein the uncertainty of the determination of the phase center is used as an indicator of the measurement quality.

7. The method according to claim 1, wherein the uncertainty of the determination of the phase center is compared with a threshold value so that a warning is outputted when the threshold value is at least one of reached and exceeded.

8. The method according to claim 1, wherein a transformation is performed so that near field measurement data is transformed into far field measurement data.

9. The method according to claim 1, wherein at least one of a theta range and a phi range are chosen around the main beam.

10. The method according to claim 1, wherein a measurement range is chosen that relates to a pre-defined attenuation with regard to a respective maximum of the measurement signal.

11. A measurement system for determining a phase center of an antenna under test, the system comprising:
   an anechoic space;
   a positioning unit for the antenna under test, the positioning unit being located in the anechoic space; and
   a measurement and evaluation unit;
   the measurement and evaluation unit being configured to:
      retrieve at least one angular orientation of the positioning unit,
      determine at least the phase of a measurement signal assigned to the antenna under test in dependency of at least one angular orientation of the antenna under test set by the positioning unit;
      determine the phase center of the antenna under test by using least-square techniques while taking the phase of the measurement signal into account; and
      determine an uncertainty of the determination of the phase center based on the outcome of the previous determination of the phase center of the antenna under test.

12. The measurement system according to claim 11, wherein the positioning unit is a rotatable positioning unit so that the angular orientation corresponds to a rotation angle.

13. The measurement system according to claim 11, wherein the measurement and evaluation unit is configured to compare the uncertainty of the determination of the phase center of the antenna under test with a threshold value, the measurement and evaluation unit being further configured to output a warning when the threshold value is at least one of reached and exceeded.

14. The measurement system according to claim 11, wherein the measurement system comprises at least one of a display and an output unit for outputting a warning to a user of the measurement system.

15. A measurement system for determining a phase center of an antenna under test, the antenna under test supported by a positioning unit in at least one angular orientation within an anechoic space, the system comprising:
   a measurement and evaluation unit configured to:
      determine at least the phase of a measurement signal assigned to the antenna under test in dependency of the angular orientation of the antenna under test;
      determine the phase center of the antenna under test by using least-square techniques while taking the phase of the measurement signal into account; and
      determine an uncertainty of the determination of the phase center of the antenna under test based on the outcome of the previous determination of the phase center of the antenna under test.

* * * * *